United States Patent [19]
Mauer

[11] 3,959,655
[45] May 25, 1976

[54] LIGHT SOURCE FOR OPTICAL SOUND RECORDING AND REPRODUCTION APPARATUS

[75] Inventor: Paul B. Mauer, Rochester, N.Y.

[73] Assignee: Eastman Kodak Company, Rochester, N.Y.

[22] Filed: Feb. 6, 1975

[21] Appl. No.: 547,661

[52] U.S. Cl. .......................... 250/474; 179/100.3 E; 179/100.3 Z; 250/487
[51] Int. Cl.² .......................................... G01M 5/00
[58] Field of Search ............. 179/100.3; 352/1, 27; 250/461, 474, 487

[56] References Cited
UNITED STATES PATENTS

| | | |
|---|---|---|
| 2,036,275 | 4/1936 | Holman .................. 179/100.3 E |
| 2,077,102 | 4/1937 | Fardon ........................ 352/1 |
| 2,350,786 | 6/1944 | Marette et al. ............... 179/100.3 E |
| 3,027,219 | 3/1962 | Bradley ....................... 346/110 |
| 3,059,117 | 10/1962 | Boyle et al. ................... 250/458 |
| 3,354,342 | 11/1967 | Ohntrup et al. .............. 179/100.3 Z |
| 3,426,194 | 2/1969 | Donne ......................... 250/461 |
| 3,484,607 | 12/1969 | McGuire et al. ............... 250/458 |
| 3,522,388 | 7/1970 | Miller .......................... 352/27 |
| 3,654,463 | 4/1972 | Geusic et al. .................. 250/458 |

Primary Examiner—Harold A. Dixon
Attorney, Agent, or Firm—T. H. Close

[57] ABSTRACT

A light source suitable for use in optical sound recording and reproduction apparatus includes a light emitting diode and a thin sheet of transparent material containing a fluorescent dye used to concentrate the output of the light emitting diode to a fine line.

2 Claims, 5 Drawing Figures

LIGHT SOURCE FOR OPTICAL SOUND RECORDING AND REPRODUCTION APPARATUS

BACKGROUND OF THE INVENTION

1. Field of the Invention

This invention relates to a light source for use in optical sound recording and reproduction apparatus and more particularly to such a light source wherein the light from a light emitting diode is concentrated to a fine line by means of a thin sheet of fluorescent material.

2. Description of the Prior Art

A typical sound recording system includes a microphone, an amplifier, a transducer, and a recording medium. The microphone reacts to sound vibrations to produce a signal having a component that is characteristic of the sound. The amplifier amplifies the signal from the microphone and the transducer changes the amplified signal from one form of energy to another form which is effective to react upon the recording medium to produce a recorded signal.

In some sound motion picture cameras, the sound recording medium is the light sensitive film itself. In the sound recording portion of such a camera, sound is converted by a microphone from acoustical energy to electrical energy, which is amplified and applied to a modulated light source that exposes a sound track on the moving strip of film. This film, when properly developed, carries a photographic record having variations that are representative of the frequency and intensity of the sound which was recorded. The variations representing the sound vibrations can be variations either in the width of the track or in the density of the exposed track. Several approaches have been employed in sound systems to produce a variable-density sound track. One approach has been to use a constant intensity light source which is masked by a variable width slit called a light valve. The light valve consists of a pair of fine metallic ribbons (clamped at their ends under tension) and arranged parallel to one another to form a slit. The light valve is placed in a magnetic field and the current from the audio amplifier is sent through the ribbons causing them to vibrate in proportion to the intensity and frequency of the sound being recorded, thus changing the width of the slit formed by the ribbons. An image of the slit is focused on the moving photographic film by means of appropriate optics to record a variable density sound track.

Another approach for producing a variable density sound track has been to use a flashing lamp, the light output of which is caused to vary in proportion to the intensity and frequency of sound being recorded. The output of the lamp is masked by a slit and an image of the slit is projected onto the film by suitable optics.

To reproduce the sound after the film has been properly developed, the recording procedure is reversed. Light from a constant intensity lamp is focused on a narrow slit and an image of the slit is focused on the sound track of the moving film. This beam passes through the film and is modulated by the sound track in proportion to the intensity and frequency of the original sound. The modulated beam is intercepted by a photoelectric cell which generates an electrical current in proportion to the amount of light incident on its photosensitive surface. The electrical signal thus generated is amplified and used to drive loud speakers.

It is known in the art to use light emitting diodes (LEDs) as light sources to record sound tracks on photographic film and for playing back the recorded sound tracks. Being solid state devices LEDs are inherently reliable, inexpensive, require low power input, and are easily modulated. One of the main problems, however, in adapting LEDs for such applications has been the ability to get a bright enough image to expose the film. The line that is exposed on the film must be extremely fine, on the order of 10 microns wide by 500 microns long and the use of conventional optical means such as masks and lenses, light pipes, and fiber optics to concentrate the output of an LED to a fine line has not resulted in an output intense enough to adequately expose conventional photographic films.

It is well known in the art, that when a light ray traveling in an optically dense medium, e.g. glass, encounters an interface between the optically dense medium and a less optically dense medium, e.g. air, part of the ray will be refracted at the interface and part of the ray will be reflected back from the interface. As the angle of incidence between the ray and the interface increases, a situation is reached wherein the refracted portion of the light ray is parallel to the interface. For angles of incidence larger than this "critical angle" no refracted portion of the ray exists, giving rise to the phenomenon called "total internal reflection." Total internal reflection does not occur when light originates in the less optically dense medium.

In a sheet of optically dense transparent material surrounded by a less optically dense medium, light which is totally internally reflected from one surface of the sheet will encounter the opposite surface at the same critical angle and will therefore continue to be totally internally reflected from one surface of the sheet to the other until the light emerges at an edge of the sheet. This is the well known phenomenon termed "light piping." In such a sheet of optically dense transparent material, most of the light entering the sheet from the sides will pass on through the sheet since it encounters the outgoing surface of the sheet at an angle less than the "critical angle" required for total internal reflection to take place. Consequently, only a small percentage of the light entering a sheet of optically dense material will emerge at the edge due to light piping.

However, when a fluorescent dye is dispersed in the optically dense material, incoming light that may encounter the surface of the optically dense material at an angle less than the "critical angle" is absorbed by the fluorescent dye and is re-emitted in all directions. A substantial percentage of the light which is re-emitted in all directions by the fluorescent dye will be at an angle greater than the "critical angle" required for total internal reflection and will therefore be light-piped to the edges of the sheet.

SUMMARY OF THE INVENTION

In accordance with the present invention, the light emitted from a surface area of an LED is concentrated into a fine line by the use of a thin sheet of transparent material containing a fluorescent dye (hereinafter referred to as a sheet of fluorescent material) disposed adjacent to and substantially parallel with the light emitting surface area of the LED. Means are provided for supporting the sheet of fluorescent material adjacent the LED.

In a preferred embodiment a thin sheet of fluorescent material is sandwiched between the light emitting surfaces of a pair of LEDs.

BRIEF DESCRIPTION OF THE DRAWINGS

In the detailed description of the preferred embodiments presented below reference is made to the following drawings wherein.

DESCRIPTION OF THE PREFERRED EMBODIMENT

Figure 1:
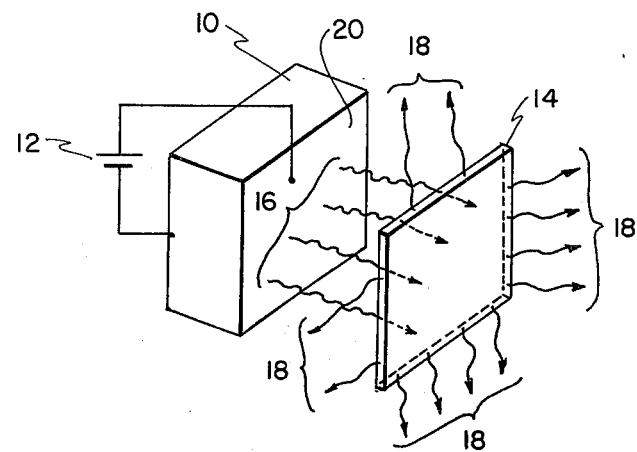
FIG. 1 is an exploded perspective view showing the principle of operation of the present invention.

Reference is now made to FIG. 1 wherein an LED 10 is connected to a conventional source of electrical power such as battery 12. Disposed adjacent the LED is a relatively thin sheet of fluorescent material 14.

In a sheet of transparent material containing a fluorescent dye, the phenomena of total internal reflection causes a certain percentage of the light falling on the sides of the sheet to emerge from the sheet at its edges. The percentage of light which emerges from the edges of the sheet is a function of the index of refraction of the sheet and the index of refraction of the medium immediately adjacent the sheet. Since the surface area of the edge of a thin sheet is small in proportion to the surface area of a side of the sheet, light emerging from the edge of the sheet appears very bright in relation to the light which is falling on the sides of the sheet. The power applied to the LED 10 by battery 12 caused the LED to emit light, shown as rays 16, from one of its surfaces. The light from the LED is absorbed by the sheet of fluorescent material 14 and a certain proportion of the light, shown as rays 18, is emitted from the edges of the sheet.

If the index of refraction of the fluorescent material is 1.5 and the surrounding medium is air, then 75% of the light which is absorbed and then re-emitted will emerge from the edges of the sheet. The brightness of the edges of the sheet will be proportional to the area of the illuminated surface divided by the area of the edges. If the sheet is 10 microns thick and 1 millimeter square, a gain of a factor of 25 will result from the geometry of the sheet, assuming that the sheet is illuminated over one side. This will yield an overall brightness gain of 18 considering the 25% loss of light that was not totally internally reflected.

If greater brightness is desired, the sheet can be illuminated from both sides by using two LEDs. Additional gain may be effected by relatively coating the unused edges of the sheet so that light that would emerge from these unused edges is reflected back into the sheet.

Figure 2:
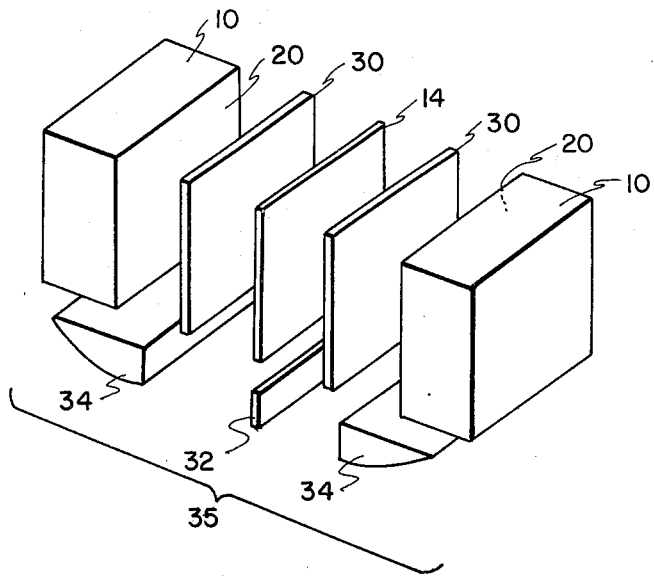
FIG. 2 is an exploded perspective view of a preferred embodiment of the invention.

Reference is now made to FIG. 2 wherein a pair of LEDs 10 having light emitting surfaces 20 are disposed with their light emitting surfaces facing each other. A sheet of fluorescent material 14 is disposed between two sheets of transparent support material 30. The index of refraction of the transparent support material must be lower than the index of refraction of the fluorescent material for total internal reflection to take place within the sheet of fluorescent material.

It is a well known phenomenon that fluorescent material absorbing light of one wavelength emits light of a lower wavelength. In designing a light source according to the present invention for use in optical recording applications, this phenomenon must be taken into account. The fluorescent material forming the sheet should be one that efficiently absorbs a wavelength of light that can be produced by an LED and emits a wavelength of light that will efficiently expose conventional photographic film. For this purpose, the combination of a green-light emitting LED and Rhodamine 6-G dye which absorbs green light and emits yellow light would be suitable.

The dye should be dispersed in a transparent medium having an index of refraction nearly identical to that of the dye to avoid objectionable scattering of the light by the dye particles. Rhodamine 6-G dye can be effectively dispersed in polystyrene having an index of refraction of about 1.59 and the resulting material can be used to form the sheet of fluorescent material 14. Magnesium fluoride which is a hard optical material having an index of refraction lower than that of polystyrene can be used to form the sheets of support material 30. If a suitable optical cement is used to attach the light emitting faces of the LEDs to the sheets of support material, about 50% of the light emitted by the LEDs and absorbed by the fluorescent material will emerge at the edges of the sheet.

To provide a wear resistant surface for the light source, a thin sheet of hard transparent material 32 such as an optical glass, having the same thickness and index of refraction as the sheet of fluorescent material 14 is disposed in edge-to-edge optical contact with the sheet of fluorescent material. The sheet of hard transparent material 32 acts as a light pipe for the light emerging from the edges of sheet 14. To complete the protective surface structure, a pair of wedge-shaped pieces of hard opaque material 34 such as magnesium fluoride containing a dispersion of carbon black particles and having the same index of refraction as the sheets of support material 30 are disposed on either side of the light pipe 32 and against the bottoms of the LEDs.

Figure 3:
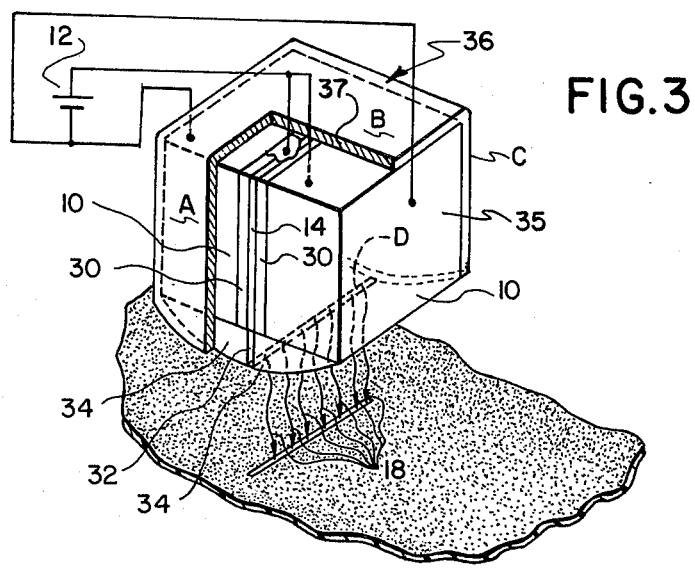
FIG. 3 is a perspective view, partially broken away showing a preferred embodiment of the invention.

Referring now to FIG. 3, a light source 36 is shown which includes the assembled light source 35 of FIG. 2 with a reflective coating 37 on sides A, B and C. A part of the reflective coating is shown broken away to reveal the underlying structure. The reflective coating serves to limit the escape of light from the unused edges of the sheet of fluorescent material. A source of electrical power 12 is shown connected to the light source. Light, shown as rays 18, is emitted from the light source along a fine line D.

Figure 4:
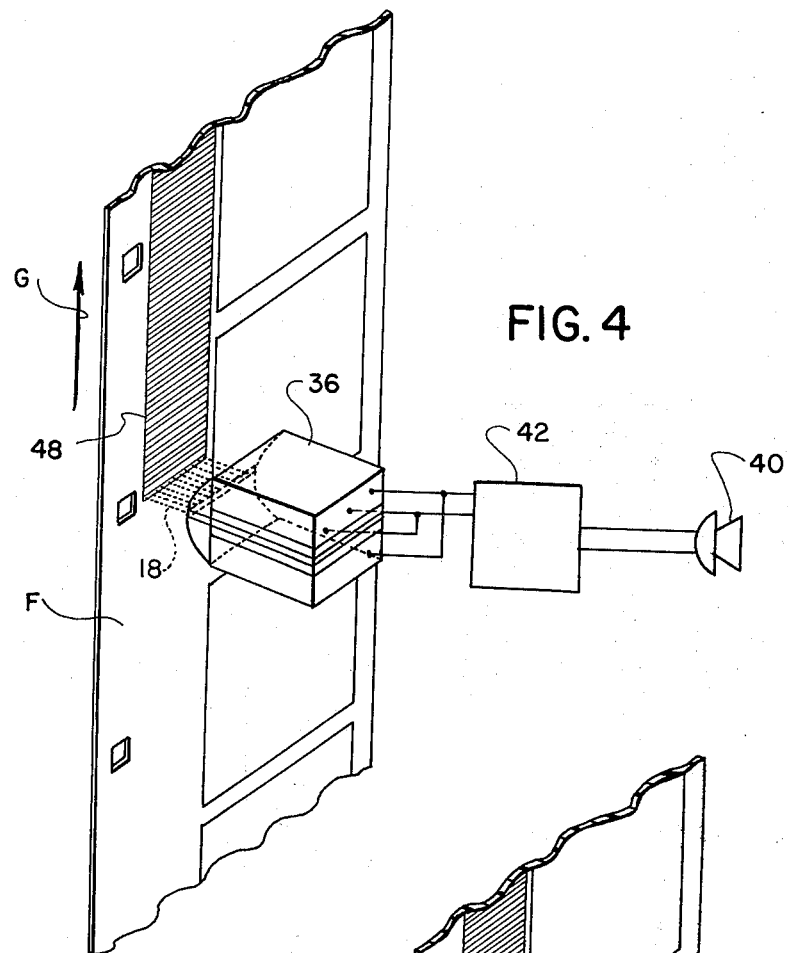
FIG. 4 shows a light source according to the subject invention being used in sound recording apparatus to record a variable density sound track on moving photographic film.

Reference is now made to FIG. 4 wherein a light source constructed according to the present invention is shown employed in optical sound recording apparatus. A microphone 40 is connected to an audio amplifier 42 which in turn is connected to the light source 36. The light source is disposed adjacent a strip of photographic film F moving in the direction of arrow G.

In operation, the microphone 40 converts the sound vibrations to an electrical signal which is amplified by the audio amplifier 42 to produce a modulated electrical signal corresponding to the sound vibrations. The amplified signal is applied to the light source which produces a light output shown as dotted lines 18 whose frequency and intensity is proportional to the original sound. The light falling on the photographic film F forms a latent variable density image 48 corresponding to the original sound.

Figure 5:
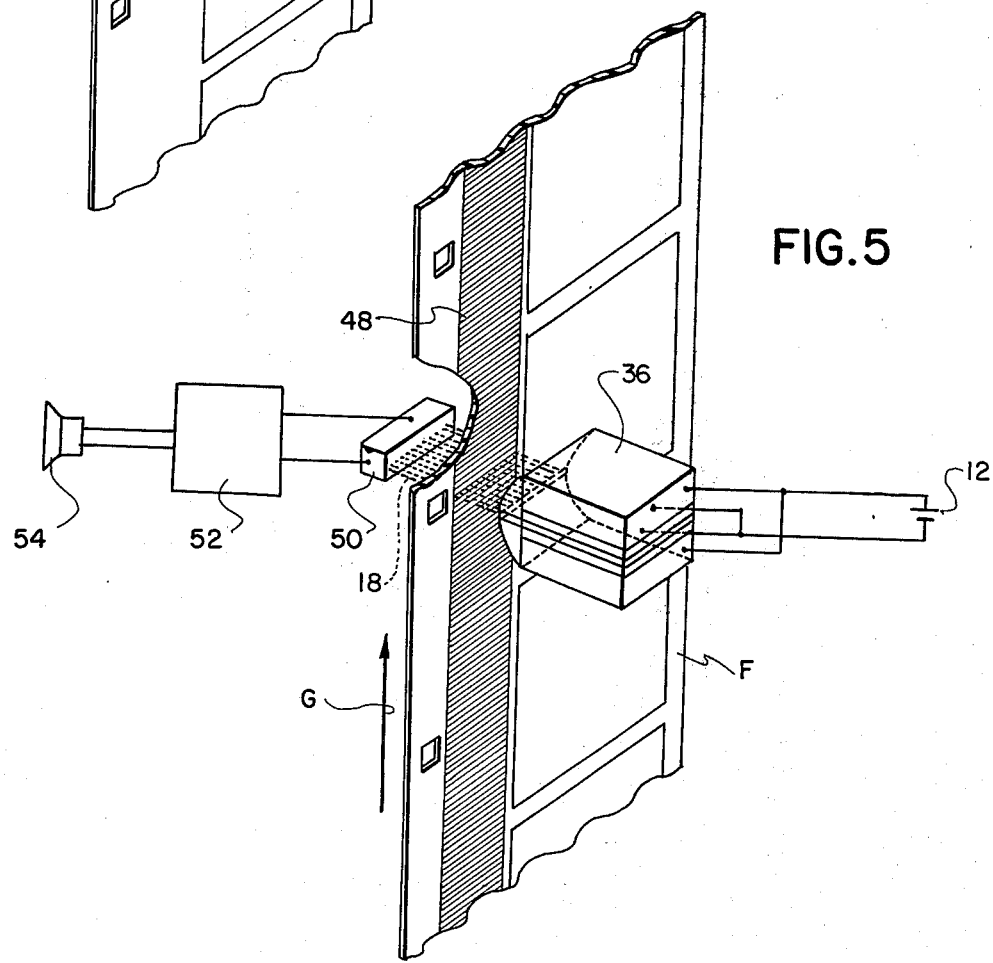
FIG. 5 shows a light source according to the subject invention being used with sound reproduction apparatus to play back a variable density sound track.

After the film has been properly developed, the sound can be reproduced on optical sound reproduction apparatus similar to that shown in FIG. 5. In the sound reproduction apparatus, the light source 36 is connected to a constant source of electrical power such as battery 12. The light source is disposed adjacent one side of the film F moving in the direction G and aligned with the developed sound track 48. A photoelectric cell 50 such as a photoelectric diode is disposed on the opposite side of the film from light source 44. The photoelectric cell is connected to audio amplifier 52 which in turn is connected to loudspeaker 54.

In operation, the light source 36 connected to the source of constant power 12 produces a constant light output shown as dotted lines 18. The developed sound track 48 on moving photographic film F modulates the beam of light being emitted from the light source. The modulated beam has a component corresponding to the original sound vibrations. Photocell 50 receives the modulated beam of light and produces an electrical signal corresponding to the modulated light beam. Audio amplifier 52 amplifies this electrical signal and drives speaker 54 to reproduce the original sound.

In FIGS. 3, 4 and 5, the light source is shown removed some distance from the surface of the film. This was done for clarity to show the light rays 18 energizing from the light source. In actual practice the light source is very close to or touching the surface of the film since light having the light source will diverge.

If the light source is to be used in optical recording apparatus, it is important that the combination of LED and fluorescent material will produce a wavelength of light that efficiently exposes the photographic film used as a recording medium. In the design of the light source for the optical playback apparatus this consideration no longer applies and LEDs emitting in the red or infrared may be considered for use.

The invention has been described in detail with particular reference to a preferred embodiment thereof, but it will be understood that variations and modifications can be effected within the spirit and scope of the invention.

I claim:

1. A light source comprising:

a green-light emitting diode having a light emitting face thereon;

a sheet of fluorescent material comprising Rhodamine 6-G dye dispersed in polystyrene, supported adjacent said light emitting face, the plane of said sheet lying substantially parallel to the plane of said light emitting face; and a sheet of magnesium fluoride disposed between said sheet of fluorescent material and said light emitting face for supporting said sheet of fluorescent material, said sheet of magnesium fuoride being transparent to light emitted from said light emitting face and having an index of refraction lower than the index of refraction of said sheet of fluorescent material, whereby, light emitted from said light emitting face is absorbed by said fluorescent material and re-emitted from said fluorescent material, a portion of said re-emitted light emerging as a narrow line of light from an edge of said sheet of fluorescent material.

2. A light source for use in optical sound recording and reproduction apparatus, comprising:

a sheet of fluorescent material having at least one straight edge;

two sheets of transparent support material having an index of refraction less than said sheet of fluorescent material, said sheet of fluorescent material being disposed between said sheets of support material;

a layer of reflective material covering the edges of said sheet of fluorescent material and the corresponding edges of said sheets of support material excepting said straight edge;

a pair of light emitting diodes, each of said light emitting diodes having a light emitting face thereon, said light emitting diodes being disposed in face to face relationship, and said two sheets of support material and said sheet of fluorescent material being disposed therebetween; and a wear resistant portion comprising a strip of hard transparent material having substantially the same thickness and index of refraction as said sheet of fluorescent material and disposed in edge to edge contact with said straight edge of said fluorescent material, and two pieces of hard opaque material having substantially the same index of refraction as said support material, said strip of hard transparent material being supported between said two pieces of hard opaque material.

* * * * *